(12) United States Patent
Weaver et al.

(10) Patent No.: US 7,279,343 B1
(45) Date of Patent: Oct. 9, 2007

(54) DE-PACKAGING PROCESS FOR SMALL OUTLINE TRANSISTOR PACKAGES

(75) Inventors: Kevin C. Weaver, San Jose, CA (US); Hiep V. Nguyen, Santa Clara, CA (US); Henry Acedo, Morgan Hill, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 268 days.

(21) Appl. No.: 11/189,487

(22) Filed: Jul. 25, 2005

(51) Int. Cl.
*H01L 21/00* (2006.01)
(52) U.S. Cl. ............................................. 438/4; 438/14
(58) Field of Classification Search .................... 438/4, 438/14, 15, 17, 18; 324/765, 769
See application file for complete search history.

(56) References Cited

U.S. PATENT DOCUMENTS

| | | | |
|---|---|---|---|
| 6,150,718 A * | 11/2000 | Livengood et al. | 257/750 |
| 6,309,899 B1 * | 10/2001 | Mahanpour et al. | 438/15 |
| 6,329,212 B1 * | 12/2001 | Dobrovolski | 438/15 |
| 6,429,028 B1 * | 8/2002 | Young et al. | 438/4 |
| 6,813,828 B2 * | 11/2004 | Dlugokecki et al. | 257/E21.502 |
| 6,884,663 B2 * | 4/2005 | Dlugokecki et al. | 438/126 |
| 6,917,011 B2 * | 7/2005 | Hong et al. | 257/E21.502 |
| 7,063,987 B2 * | 6/2006 | Rowe et al. | 438/4 |
| 2002/0048825 A1 * | 4/2002 | Young et al. | 438/4 |

* cited by examiner

*Primary Examiner*—Kevin M. Picardat
(74) *Attorney, Agent, or Firm*—Beyer Weaver LLP

(57) ABSTRACT

A method to de-packaging a semiconductor device to access and test the die within the package. The method involves initially removing molding compound from a first surface of the package to expose the underlying die attach pad of the package. A mask is then formed over the die attach-pad. An etching solution is subsequently introduced through an opening in the mask to etch away the die attach pad. Once the etching is complete, the die attach film is removed. An ohmic contact is then formed on the exposed back surface of the die. The ohmic contact is used to ground the die so that the electrical circuitry on the device will operate properly. Once grounded, the circuitry on the die can be electrically tested and debugged.

15 Claims, 4 Drawing Sheets

DE-PACKAGING PROCESS FOR SMALL OUTLINE TRANSISTOR PACKAGES

FIELD OF THE INVENTION

The present invention relates generally to the testing and analysis of semiconductor integrated circuits, and more particularly, to a de-packaging process for small outline transistor (SOT) packages to facilitate access to the back surface of the die in the package for electrical testing and debugging of the device.

BACKGROUND

Semiconductor dice are typically fabricated in wafer form. A silicon wafer undergoes a series of well known processing steps to fabricate a plurality of dice on the wafer. After fabrication, the individual die are separated by cutting or sawing the wafer along the scribe lines. The individual die are then encapsulated in a package. After a new die is designed and fabricated, it will often undergo a series of tests to debug the device. The die is also often subjected to electrical testing to determine if it operates within the intended design parameters. Electrical parameters, such as clock speed or frequency, signal rise and fall times, overshoot and undershoot, bandwidth, the skew between input/output pins, etc. are all tested under various conditions to determine if the device is operating within its design specifications.

One type of package used in the semiconductor industry is called a Small Outline Transistor (SOT) package. A SOT Package is typically used for very small die, for example, ranging from 5,814 or smaller to 36,920 or larger square mills (3.6 to 23 square mm). The type of die used in SOT packages include circuits such as power regulators, power management chips, temperature sensors, and the like.

A typical SOT package includes a die mounted onto a die attached pad of a lead frame. The die attach pad is usually connected to a ground lead of the lead frame so that the back surface of the die is electrically grounded. Wire bonds are formed between contract pads on the die and other leads on the lead frame. These leads are used to provide power and signals to and from the die. The entire structure, including the die, die pad, wire bonds and leads are encapsulated in a molding compound.

After semiconductor devices are packaged, they are typically debugged. A device is debugged for a several reasons, usually either for failure analysis or reliability testing. Before a product is released, the device will typically be subject to a host of electrical tests to make sure that it performs to specification. If a product fails in the field, the semiconductor vendor will typically want to analyze the device and identify any design or manufacturing defects.

SOT die are difficult to debug for a number of reasons. SOT packages are typically so small, it is difficult to access the die within the package. Furthermore, even if the top surface of the die can be accessed, the multiple levels of metal interconnect and dielectric layers found on most die makes it difficult to access the underlying circuitry. It is therefore often easier to access the circuitry from the back surface of the die. To do so, however, it often requires the removal of the die attached pad which is electrically coupled to ground. With the back surface of the die not grounded, the circuitry on the die may not operate properly. Electrical testing and evaluation of the circuitry on the die is therefore problematic.

A process to de-package a SOT package and to ground the die so that the circuitry on the die can be accessed and properly tested and debugged is therefore needed.

SUMMARY OF THE INVENTION

The present invention is directed to a method of de-packaging a semiconductor device to access and test the die within the package. The method comprises initially removing molding compound from a first surface of the package to expose the underlying die attach pad of the package. A mask is then formed over the die attach-pad. An etching solution is subsequently introduced through an opening in the mask to etch away the die attach pad. Once the etching is complete, the die attach film is removed. An ohmic contact is then formed on the exposed back surface of the die. The ohmic contact is used to ground the die so that the electrical circuitry on the device will operate properly. Once grounded, the circuitry on the die can be electrically tested and debugged.

BRIEF DESCRIPTION OF THE DRAWINGS

The invention, together with further advantages thereof, may be best understood by reference to the following description taken in conjunction with the accompanying drawings in which.

Like references numbers in the figures indicate like elements.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known operations have not been described in detail so not to unnecessarily obscure the present invention.

Figure 1:
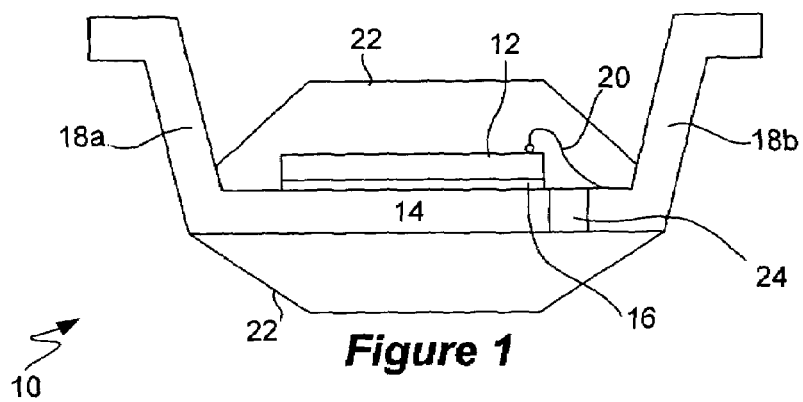
FIG. 1 is a cross section diagram of an SOT section diagram of an SOT package.

Referring to FIG. 1, a cross section of a SOT package is shown. The package 10 includes a die 12 affixed to a die attached pad 14 using a die attach film 16, such as FH-800 from Hitachi. The die attach pad 14 is part of a lead frame that includes a plurality of leads 18. In the example shown, lead 18*a* is connected to the die attach pad 14, whereas the other lead 18*b* is connected to a bond pad (not visible) on the top or active surface of the die 12 using a bond wire 20. The entire package 10, including the die 12, die attach pad 14, wire bonds 20, and the non-external portions of the leads 18, are encapsulated in the molding compound 22. In one embodiment, the molding material 22 is GR9820 from Loctite Corporation. Although only two leads 18*a* and 18*b* are shown in the cross section, it should be noted that a typical SOT package will have additional leads. For example, a typical SOP package may have several signal leads, input and output leads as well as ground and power supply leads. One lead, in this instance 18A, is used as a ground lead that is directly coupled to the die attach pad 14. By grounding the die attach pad 14, the back or non-active surface of the die 12 is also grounded, which is beneficial to the electrical operation of the circuitry on the die.

Figure 2A:
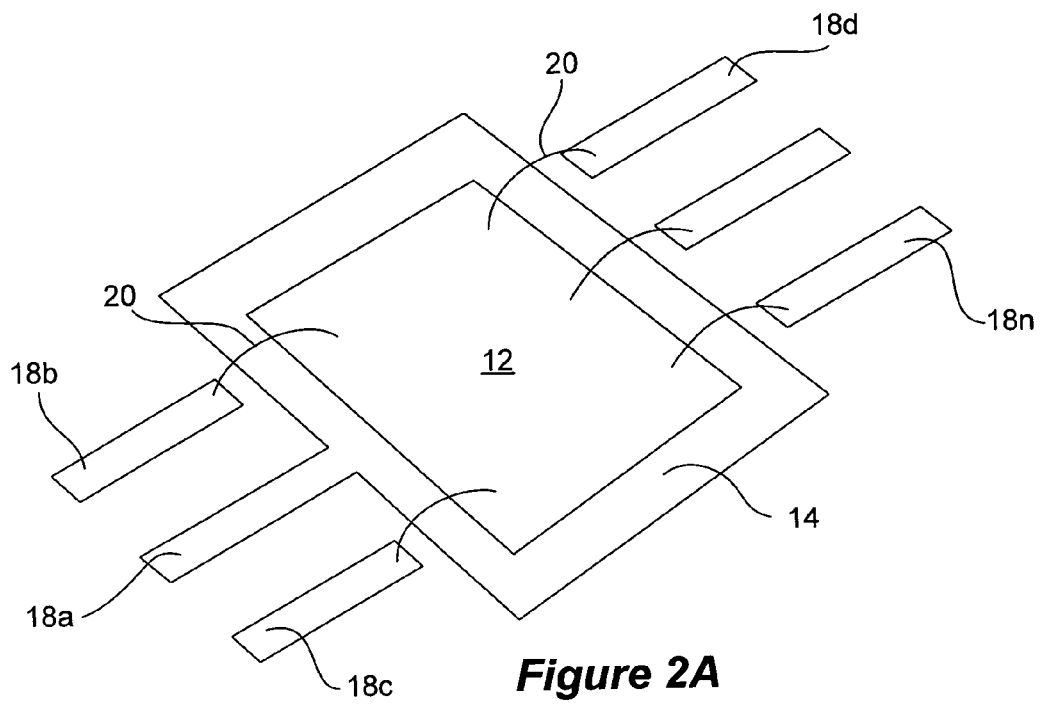
FIGS. 2A and 2B are top and bottom perspective views of a lead frame and die of a SOT package.
Figure 2B:
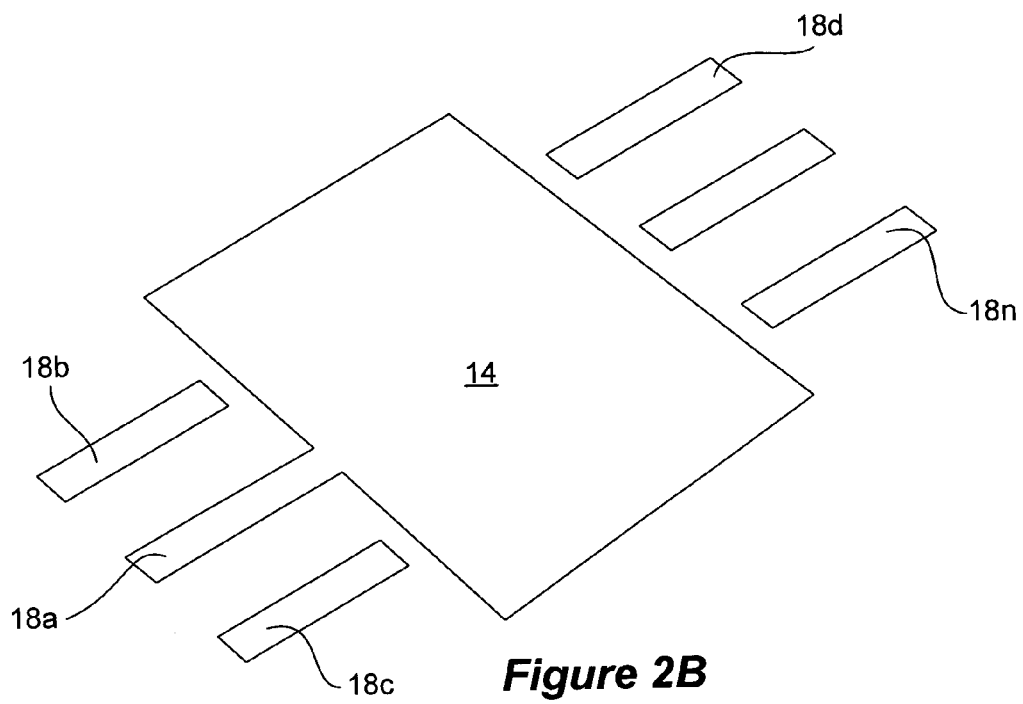

Referring to FIGS. 2A and 2B, top and bottom views of the lead frame of an SOT package are shown respectively. FIG. 2A shows a die 12 mounted onto the die attach pad 14. Lead 18a is connected to the die attach pad 14. The remaining leads 18b-18n surround but do not contact the die attach pad 14. This arrangement makes it convenient to form wire bonds 20 between the die 12 and the leads 18b-18n. FIG. 2B shows a bottom view of the die attach pad 14 and the surrounding leads 18. Note again that lead 18a is connected to the die attach pad 14, whereas the other leads 18b-18n surround but do not contact the die attach pad 14. The die 12 is not visible from this view. The number of leads shown is only intended to be exemplary. Either more or less leads may be used with a SOT package, depending on the application and the type of die used.

Figure 3A:
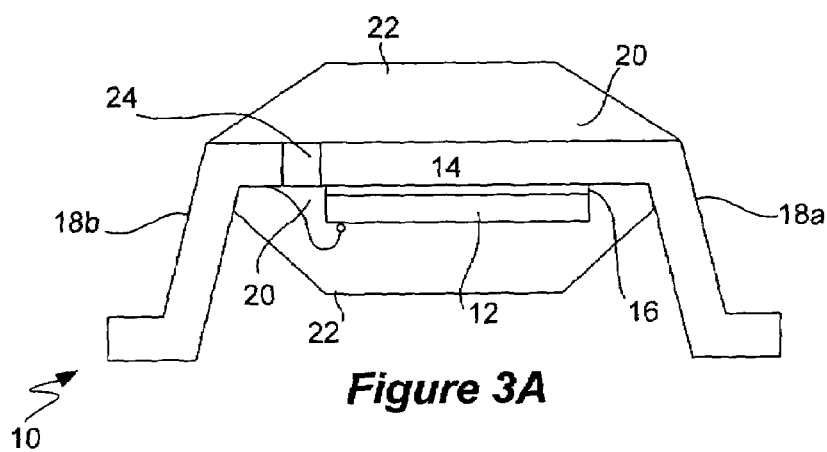
FIGS. 3A-3G are a series of cross section diagrams of an SOT package during the de-packaging process of the present invention.
Figure 3B:
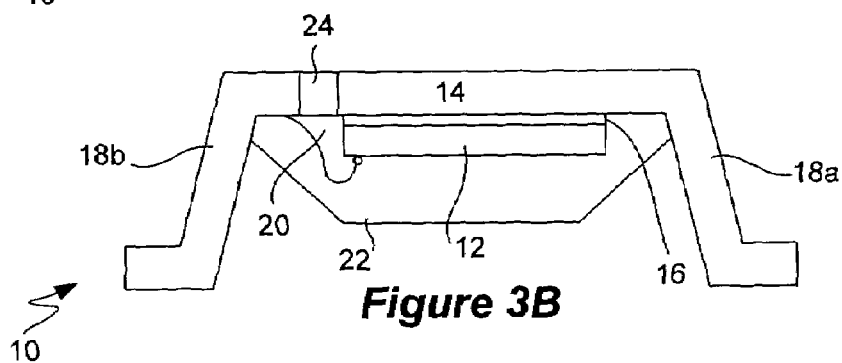

Referring to FIGS. 3A-3B, a series of cross-sections of a SOT package is shown at various stages of the de-packaging process of the present invention.

In FIG. 3A, the SOT package 10 is shown so that the active surface of the die 12 and the external portions of the leads 18 are facing downward. The package 10 is typically oriented in this direction when mounting to a printed circuit board. This orientation also makes the back or non-active surface of the die accessible through the overlying molding compound 22 and die attach pad 14.

In FIG. 3B, the package 10 is shown with the molding compound 22 over the die attach pad 14 removed. According to various embodiments, the molding compound 22 may be removed in a number of ways. In one embodiment, the molding compound 22 is removed using a fuming nitric or sulfuric acid. Alternatively, the molding compound 22 can be removed by mechanically grinding the material using an abrasive film. The abrasive film is affixed to a grinding wheel. As the wheel is rotated, the molding compound 22 is grinded away and removed. With either embodiment, the net result is the back surface of the die attach pad 14 is exposed.

Figure 3C:
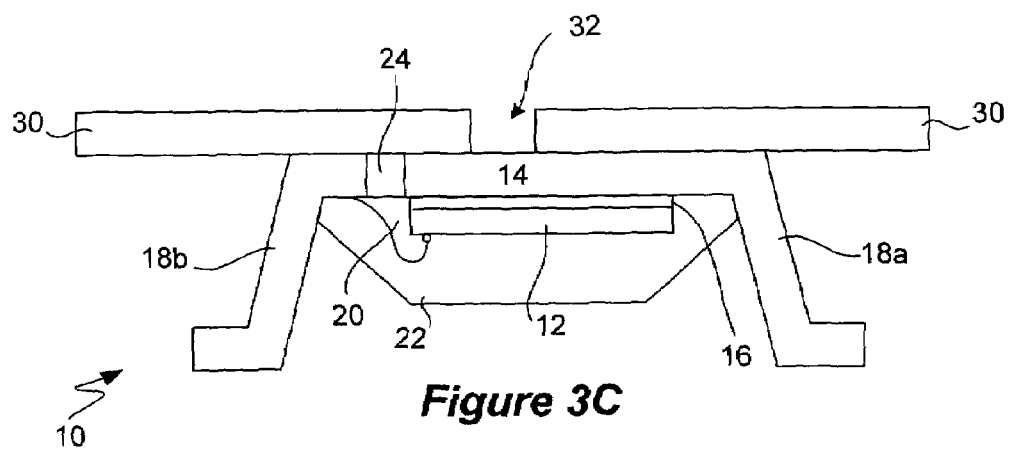

In FIG. 3C, a mask 30 is formed over the exposed die pad 14. An opening 32 is then formed in the mask 30. The mask 30 can also be made from a number of different materials. For example, the mask can be made from either a polyimide layer or a photo resist layer formed over the die attach pad 14. The opening 32 is then formed using conventional semiconductor processing techniques, such as laser or Focused Ion Beam (FIB).

Figure 3D:
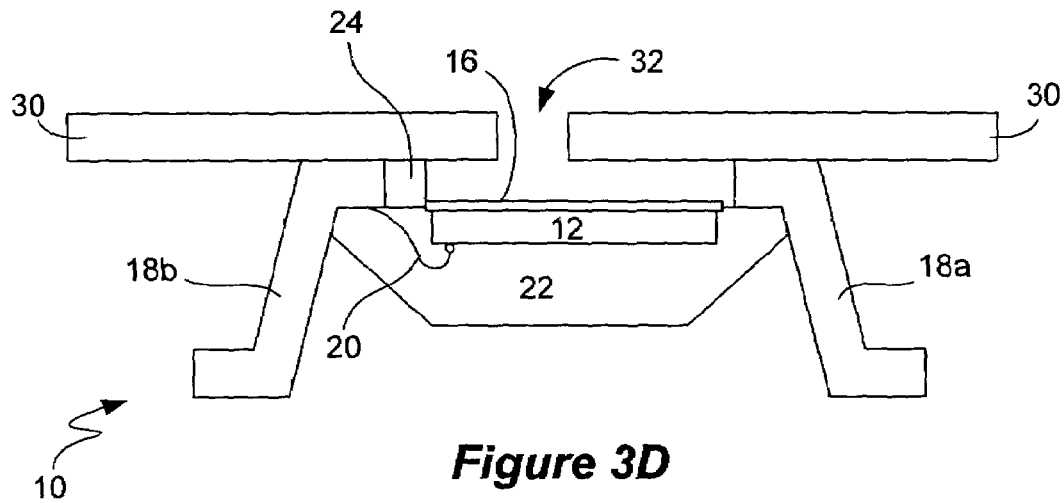

In FIG. 3D, the die attach pad 14 is removed by a non-directional or isotropical etch. An etching solution, such as a 70% nitric acid solution, is introduced through the opening 32 in the mask. The solution etches away the metal (typically copper) of the die attach pad 14. It should be noted that the regions 24 of molding compound 22 between the die attach pad 14 and the leads 18b-18n act as an etch-stop, preventing theses leads from being exposed to the etching solution. The etch is performed until the die attach pad 14 is entirely removed.

Figure 3E:
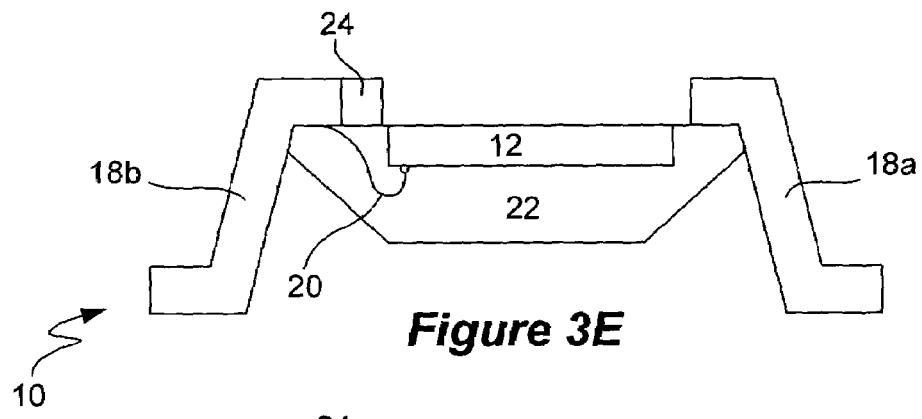

In FIG. 3E, the die attach film 16 is removed. After the mask 30 is removed, a fuming nitric acid is applied to the die attach film 16. The fuming nitric acid breaks down the film, enabling it to be wiped off the back surface of the die 12. In one embodiment, the die attach film is wiped away using a cotton swab and acetone.

Figure 3F:
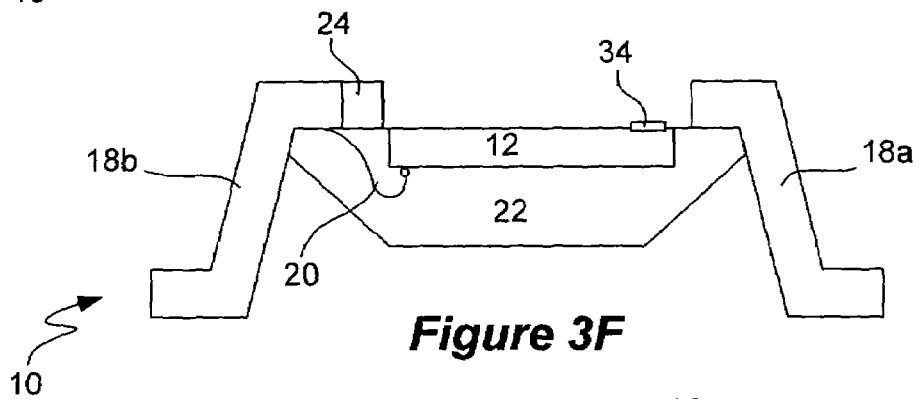

In FIG. 3F, an ohmic contact 34 made from a thin film metal is formed on the back or non-active surface of the die 12. In one embodiment, the ohmic contact 34 is made by placing the package 10 into a Focus Ion Beam (FIB) system where an ion beam is focused through a gas containing a metal onto the back surface of the die 12. The ion beam passes through the gas, driving the metal onto the back surface of the die to form the thin film. In various embodiments, the metal in the gas is either platinum or tungsten, forming the ohmic contact 34 of the same metal on the back surface of the die 12. In other embodiments, the metal may be copper, aluminum, or another metal formed by sputter deposition or evaporation.

Figure 3G:
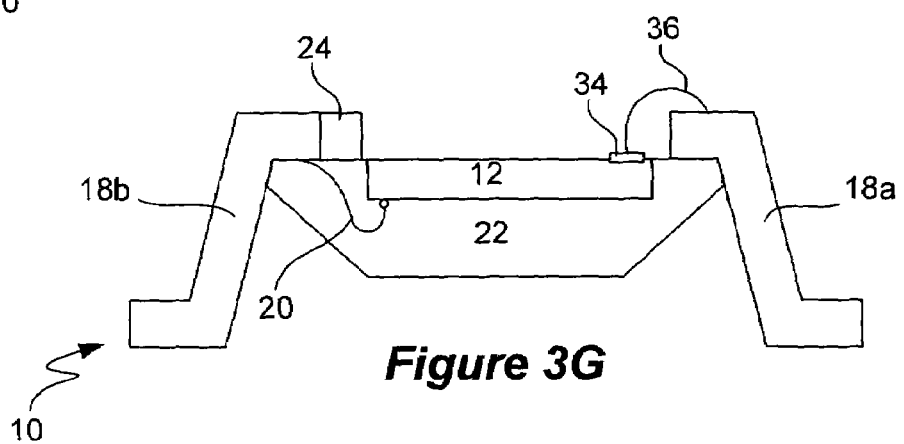

In FIG. 3G, a wire bond 36 is formed between the ohmic contact 34 and the lead 18a. With the wire bond 36, the back surface of die 12 is again grounded. With the non-active surface of the die 12 exposed and grounded, the chip can undergo electrical testing and debugging. This process will typically involve probing circuitry on the die 12, performing electrical tests and the detection of photons of light from the die 12.

Figure 4:
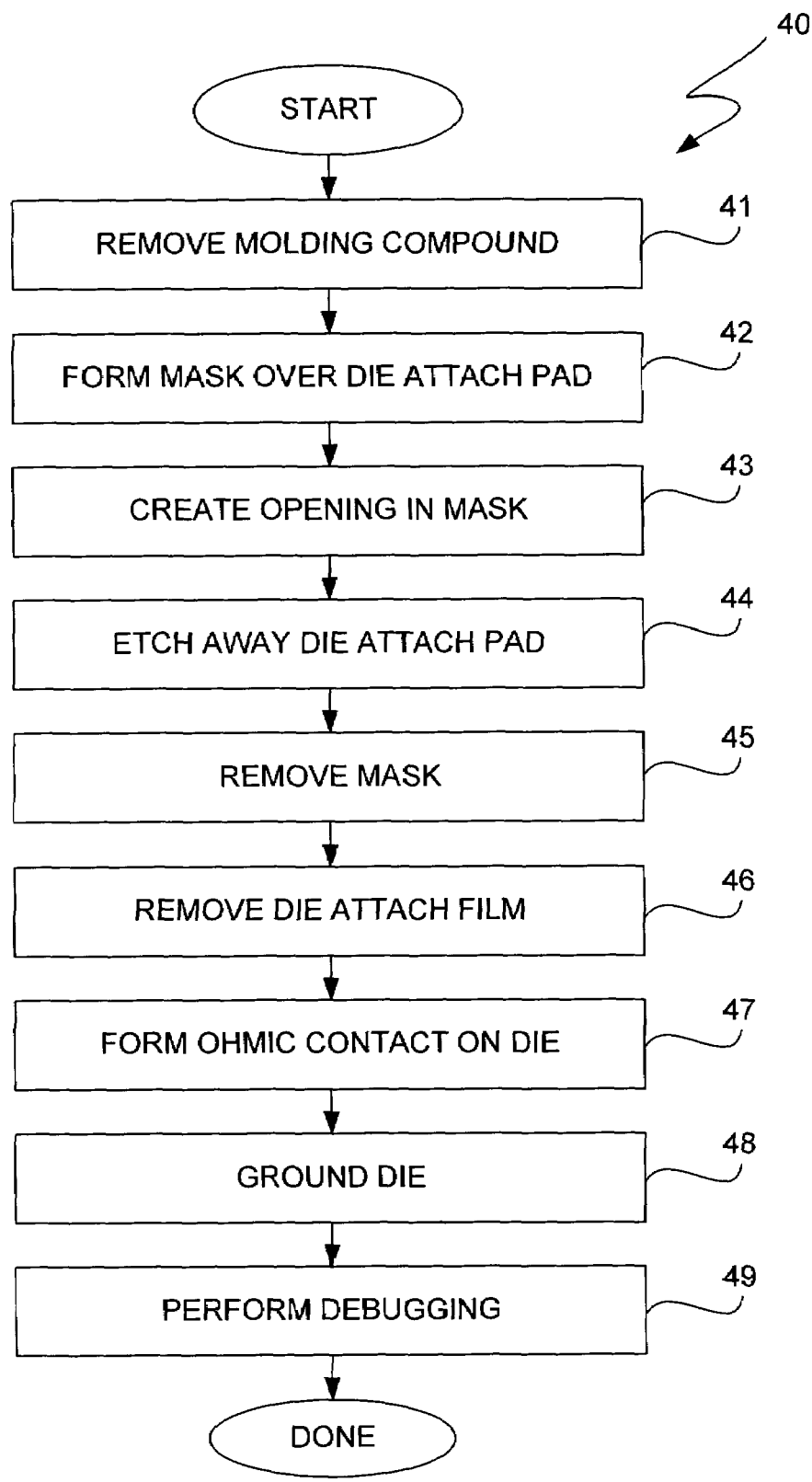
FIG. 4 is a flow diagram illustrating the de-packaging sequence of the present invention.

Referring to FIG. 4, a flow diagram illustrating the de-packaging and debugging sequence of the present invention is shown. In the initial step, molding compound 22 is removed from the package 10 in the area adjacent the non-die attach surface of the die attach pad 14 (box 41). A mask 30 is formed over the exposed portion of the die attach pad (box 42). An opening 32 is next formed in the mask (box 43). An etching solution is introduced through the opening 32 to etch away the die attach pad 14. Once the die attach pad 14 is etched away, the mask 30 is removed (box 45). The die attach film 16 is removed (box 46) and then an ohmic contact 34 is formed on the non-active, exposed surface of the die 12 (box 47). The die is then grounded using a bond wire connected between the ohmic contact (box 48) and ground. The die is then subject to electrical testing and debugging (box 49).

While this invention has been described in terms of several preferred embodiments, there are alteration, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

We claim:

1. A method of accessing and testing a die in a semiconductor package, comprising:
   removing molding compound from a first surface of the package to expose a die attach pad in the package;
   forming a mask layer over the die attach-pad;
   creating an opening in the mask over the die attach pad;
   etching away the die attach pad by introducing an etch solution through the opening formed in the mask;
   removing the mask after the die attach pad is etched away;
   exposing the die by removing a die attach film used to attach the die to the die attach pad;
   forming an ohmic contact on the exposed die;
   grounding the die through the ohmic contact; and
   performing debugging on the die.

2. The method of claim 1, wherein removing the molding compound further comprises grinding away the molding compound using an abrasive.

3. The method of claim 1 wherein removing the molding compound further comprises exposing the molding compound to either a fuming nitric acid or a fuming sulfuric acid.

4. The method of claim 1, wherein forming the mask further comprises forming a polyimide mask over the die attach pad.

5. The method of claim 1, wherein forming the mask further comprises forming a photo resist mask over the die attach pad.

6. The method of claim 1, wherein etching away the die attach pad further comprises performing an isotropical wet etch until the die attach pad is etched away.

7. The method of claim 1, wherein etching away the die attach pad further comprises introducing a nitric acid etch solution through the opening in the mask.

8. The method of claim 1 wherein removing the die attach film further comprises exposing the die attach film to a fuming nitric acid and then wiping the die attach film away.

9. The method of claim 1 wherein forming the ohmic contact further comprises forming a metal film onto the exposed die.

10. The method of claim 1, wherein the metal film comprises one of the following metals: platinum, tungsten, copper, aluminum or gold.

11. The method of claim 1, wherein the ohmic contact is formed by directing a focus ion beam through a gas containing a metal to deposit the metal onto the exposed die.

12. The method of claim 1, wherein forming the ohmic contact further comprises forming a wire bond between a lead of the package connected to ground and a metal film formed on the exposed die.

13. The method of claim 1, wherein the exposed die is the back surface of the die.

14. The method of claim 1, wherein debugging the die further comprises performing electrical testing on the die.

15. The method of claim 1, wherein debugging the die further comprises detecting photons of light generated by the switching of transistors on the die.

* * * * *